(12) United States Patent
Owsley et al.

(10) Patent No.: US 8,542,136 B1
(45) Date of Patent: Sep. 24, 2013

(54) DATA COMPRESSION SYSTEM AND RELATED METHODS

(75) Inventors: Patrick Owsley, Moscow, ID (US); Brian A. Banister, Moscow, ID (US); Jason Franklin, Moscow, ID (US)

(73) Assignee: Comtech EF Data Corp., Tempe, AZ (US)

( * ) Notice: Subject to any disclaimer, the term of this patent is extended or adjusted under 35 U.S.C. 154(b) by 845 days.

(21) Appl. No.: 12/753,622

(22) Filed: Apr. 2, 2010

Related U.S. Application Data (60) Provisional application No. 61/166,216, filed on Apr. 2, 2009.

(51) Int. Cl.
*H03M 7/00* (2006.01)
(52) U.S. Cl.
USPC .............................................. 341/60; 341/50
(58) Field of Classification Search
USPC .................... 341/60, 67, 65, 55, 51; 370/389
See application file for complete search history.

(56) References Cited

U.S. PATENT DOCUMENTS 7,728,742 B2 * 6/2010 Gonion ........................... 341/60

* cited by examiner

*Primary Examiner* — Joseph Lauture
(74) *Attorney, Agent, or Firm* — Booth Udall Fuller, PLC (57) ABSTRACT

A data compression system comprising a transmit side having a first receive interface adapted to receive a first quantity of data from a first channel and a compression controller coupled to the first receive interface, a lossless compression controller, and a bandwidth monitor, the lossy compression controller and the bandwidth monitor coupled to a first transmit interface adapted to transmit a compressed first quantity of data into a second telecommunication channel wherein the bandwidth monitor evaluates the bandwidth of the second telecommunication channel and communicates with the compression controller. A decimation controller is adapted to lossy compress a portion of a second data quantity in the first telecommunication channel in response to a lossy compression control signal communicated by the compression controller to form a reduced second data quantity if the compression controller determines, that the bandwidth second transmission channel is insufficient to carry the first data quantity when compressed.

18 Claims, 5 Drawing Sheets

DATA COMPRESSION SYSTEM AND RELATED METHODS

CROSS REFERENCE TO RELATED APPLICATIONS

This document claims the benefit of the filing date of U.S. Provisional Patent Application 61/166,216, entitled "Data Compression Systems and Related Methods" to Owsley et al., which was filed on Apr. 2, 2009, the disclosure of which is hereby incorporated entirely herein by reference.

BACKGROUND

1. Technical Field

Aspects of this document relate generally to data compression systems and related methods, such as components and algorithms used to reduce the size and/or bandwidth required to transmit a quantity of data information. More specific implementations involve compressing data in a data channel.

2. Background Art

Conventionally, data compression systems compress a stream of digital data signals (uncompressed bits) into compressed digital data signals (compressed bits), which require less bandwidth (fewer bits) than the original digital data signals, and that decompress the compressed digital data signals back into the original data signals or a close approximation thereof. Lossless data compression systems decompress the compressed digital data signals back into the original data signals exactly. Thus, lossless data compression refers to any process that converts data into an alternative data form that requires less bandwidth, i.e., has fewer bits, than the data converted in a process that is reversible so that the original data can be recovered.

Accordingly, the purpose of data compression systems is to effect a savings in an amount of storage required to hold the data or the amount of time (or bandwidth) required to transmit the data. By decreasing required space for data storage or required time (or bandwidth) for data transmission, data compression results in a monetary and resource savings.

To be of practical and general utility, a digital data compression system should satisfy certain criteria. Specifically, one criterion is that the system should provide high performance, i.e., compression/decompression rates, for both compression and decompression with respect to the data rates in the communications channel being utilized, be it a data bus, a wired network, a wireless network or the like. In other words, data transmission rates seen by a sender of uncompressed data and a receiver of the uncompressed data should not be reduced as a result of compression/decompression processing overhead. In fact, effective data rates achieved, may be significantly increased over slow communications channels, because more original data can be transmitted per unit time, if the original data is compressed preceding and decompressed following transmission, because there is less compressed data to transmit than there would have been with the original data.

Another important criterion in the design of a data compression and decompression system is compression effectiveness. Compression effectiveness is characterized by the compression ratio of the system, i.e. a larger compression ratio indicates greater compression effectiveness. However, in order for data to be compressible using a lossless data compression system, the data to be compressed must contain redundancies. As a result, the compression ratio, or compression effectiveness, in a lossless data compression system (and to a lesser degree in a lossy data compression system) is a function of the degree of redundancy in the data being compressed. The compression effectiveness of any data compression system is also affected by how effectively the data compression system exploits, for data compression purposes, the particular forms of redundancy in the original data.

SUMMARY

Aspects of this document relate to data compression systems and methods. In one aspect, a method of compressing data comprises receiving, at an input of a first processor that is included in a transmit side of a data compression system, a first quantity of data from a first telecommunication channel having a known bandwidth, losslessly compressing the first quantity of data using a lossless compression algorithm and the first processor to form losslessly compressed data, and evaluating, using the first processor, whether a bandwidth of a second telecommunication channel is sufficient to carry the losslessly compressed data. The method further comprises receiving at the input a second quantity of data following the first quantity of data in a time order of the data in the first telecommunication channel. If the bandwidth of the second telecommunication channel is evaluated to be insufficient, then the system lossy compresses the second quantity of data using a lossy compression algorithm and the first processor, to form first reduced data, and then losslessly compresses the first reduced data using the lossless compression algorithm and the first processor to form first compressed data. If the bandwidth of the second telecommunication channel is evaluated to be sufficient, then the system losslessly compresses the second quantity of data using the lossless compression algorithm and the first microprocessor to form second compressed data and transmits the first compressed data and the second compressed data into the second telecommunication channel using a transmission module.

Particular implementations may include one or more of the following. Receiving the first compressed data and the second compressed data at an input of a second processor included in a receive side of the data compression system, decompressing the first compressed data and the second compressed data using a decompression algorithm and the second processor to form an uncompressed data output, and transmitting the uncompressed data output into a third telecommunication channel. The lossy compressing the second quantity of data further comprises eliminating a portion of the second quantity of data using the first processor to form the first reduced data by decimating data for a predetermined decimation time period from one or more traffic channels included in the second quantity of data and including in a time sequence of each of the one or more traffic channels a third quantity of data, the third quantity of data included in a time period of each of the one or more traffic channels that is equal to the predetermined decimation time period where the third quantity of data is taken from the time sequence of each of the one or more traffic channels immediately preceding a location in the time sequence of the predetermined decimation time period.

Decimating data for the predetermined decimation time period from one or more traffic channels further comprises decimating using a predefined traffic channel decimation scheme that ensures that any of the one or more traffic channels including framing information are not decimated. Decimating data for the predetermined decimation time period further comprises ensuring that each of the one or more traffic channels is decimated substantially equally The method further comprises depacketizing a plurality of packets including the first compressed data and the second compressed data using the second processor prior to decompressing the first compressed data and the second compressed data and packetizing the first compressed data output to form a plurality of packets using the first processor. The method also further comprises demultiplexing at least two of the one or more traffic channels included in the second quantity of data prior to decimating data from one of the one or more traffic channels and multiplexing at least two of the one or more traffic channels included in the uncompressed data output to form a multiplexed uncompressed data output, wherein transmitting the uncompressed data output further comprises transmitting the multiplexed uncompressed data output into the third telecommunication channel.

In another aspect, the method comprises controlling a latency of the first compressed data and of the second compressed data transmitted into the second telecommunication channel by organizing and processing the first compressed data and the second compressed data in short blocks. Lossy compressing the second quantity of data further comprises eliminating a portion of the second quantity of data using the first processor to form the first reduced data by decimating data from each of one or more traffic channels included in the second quantity of data for a predetermined decimation time period using the first processor, generating control information including the identity of each of the one or more traffic channels decimated and the location of decimation in a time sequence of each of the one or more traffic channels and transmitting the control information to an un-decimation module associated with the second processor included in the receive side and wherein decompressing the first compressed data and the second compressed data with the second processor further comprises determining whether the portion of the second quantity of data was eliminated using the control information and if so, decompressing the first reduced data using the decompression algorithm and the second processor forming first uncompressed reduced data and replacing the data decimated from each of the one or more traffic channels to form a regenerated uncompressed data output using the second processor by including, at the location of decimation in the time sequence of each of the one or more traffic channels of the first uncompressed reduced data identified as decimated, a quantity of data from each traffic channel for a time period equal to the predetermined decimation time period taken from the time sequence of each traffic channel identified as decimated immediately prior to the location of the decimation. If not, decompressing the second compressed data using the decompression algorithm and the second processor to form the uncompressed data output and wherein transmitting the uncompressed data output into the third telecommunication channel further comprises transmitting the uncompressed data output or the regenerated uncompressed data output into the third telecommunication channel.

Particular implementations may include one or more of the following. Decimating data from each of one or more traffic channels further comprises decimating using a predefined traffic channel decimation scheme that ensures that any of the one or more traffic channels including framing information are not decimated. Decimating data from each of one or more traffic channels further comprises ensuring that each of the one or more traffic channels is decimated substantially equally.

The method further comprises demultiplexing at least two of the one or more traffic channels included in the second quantity of data prior to decimating data from one of the one or more traffic channels and multiplexing at least two of the one or more traffic channels included in the uncompressed data output or the regenerated uncompressed data output to form a multiplexed uncompressed data output and wherein transmitting the uncompressed data output or the regenerated uncompressed data output further comprises transmitting the multiplexed uncompressed data output into the third telecommunication channel. The method further comprises controlling a latency of the first compressed data and the second compressed data transmitted into the second telecommunication channel by organizing and processing the first compressed data and the second compressed data in short blocks.

In another aspect, a data compression system configured to transmit and receive compressed data comprises a transmit side comprising a first receive interface adapted to receive a first quantity of data from a first telecommunication channel and a compression controller coupled to the first receive interface, to a lossless compression controller, and to a bandwidth monitor, the lossy compression controller and the bandwidth monitor coupled to a first transmit interface adapted to transmit a compressed first quantity of data into a second telecommunication channel wherein the bandwidth monitor evaluates the bandwidth of the second telecommunication channel and communicates bandwidth information to the compression controller wherein a decimation controller is adapted to lossy compress a portion of a second quantity of data in a time sequence of data in the first telecommunication channel in response to a lossy compression control signal communicated by the compression controller to form a reduced second quantity of data if the compression controller determines, using the bandwidth information, that the bandwidth second transmission channel is insufficient to carry the first quantity of data when compressed and wherein the compression controller is adapted to send the second quantity of data or the reduced second quantity of data to a compression processor coupled with the data compression system, to receive the compressed first quantity of data after compression, and to transmit the compressed first quantity of data into the second telecommunication channel using a first transmit interface.

Particular implementations may include one or more of the following features. A receive side integral with the transmit side, the receive side comprising a second receive interface adapted to receive a third quantity of data from a third telecommunication channel and a decompression controller coupled to the second receive interface, a decompression controller, and a lossy decompression controller wherein the decompression controller is adapted to send the third quantity of data to the compression processor and to receive a decompressed second quantity of data from the compression processor after decompression wherein the decompression controller is adapted to determine whether a portion of the decompressed second quantity of data was decimated and to transmit a lossy decompression control signal to the lossy decompression controller, and if so, the lossy decompression controller is further adapted to replace the portion of the decompressed second quantity of data in response to the lossy decompression control signal to form a regenerated decompressed third quantity of data and wherein the decompression controller is adapted to transmit the decompressed third quantity of data or the regenerated decompressed third quantity of data into the first telecommunication channel. A channel demultiplexer coupled to the first receive interface and the compression controller, the channel demultiplexer adapted to demultiplex one or more traffic channels included in the first quantity of data. A framing data detector coupled to the channel demultiplexer and the compression controller, the framing data detector adapted to evaluate the data included in each of the one or more traffic channels to determine which of the one or more traffic channels includes frame information and to transmit a frame channel control signal to the compression controller wherein the compression controller is further adapted to use the frame channel control signal to ensure that the one or more traffic channels including frame information are not lossy compressed by the lossy compression controller.

The system may further comprise a packetizer coupled to the compression controller and to the first transmit interface, the packetizer adapted to receive the compressed first quantity of data and packetize the compressed first quantity of data to form a plurality of packets and a depacketizer coupled to the decompression controller and to the second receive interface, the depacketizer adapted to depacketize a plurality of packets that include the third quantity of data.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended data compression systems and/or assembly procedures for a data compression system will become apparent for use with particular implementations from this disclosure. Accordingly, for example, although particular implementations are disclosed, such implementations and implementing components may comprise any shape, size, style, type, model, version, measurement, concentration, material, quantity, and/or the like as is known in the art for such data compression systems and implementing components, consistent with the intended operation.

Implementations of data compression systems and related methods disclosed in this document are used to compress data included in a data channel. A data channel may be a voice line (a stream of data representing the human voice) or any other type of data channel, such as, by non-limiting example, a data channel on a computer motherboard, a data channel between a Peripheral Component Interconnect (PCI) card and a computer motherboard, a data channel between a data storage device and a computer motherboard, a telecommunication channel, a satellite data link, or any other connection being used to transmit data between two devices. In particular implementations, the data in the data channel may represent information from many voice connections multiplexed in one of many possible combinations. The data channel may have a predefined bandwidth which may vary depending upon the characteristics of the channel. For example, if the data channel is a satellite link, the channel may experience a reduction in bandwidth due to rain fade at one side of the link. Implementations of data compression systems and related methods disclosed in this document may include algorithms and components capable of dynamically detecting and handling such changes in the bandwidth caused by channel conditions.

In particular implementations of data channels disclosed herein, the achievement of a particular averaged data rate across the data channel over a relatively short period may be required. This requirement may enable the connection of a data channel with a particular known data rate to be mapped to a data channel with a lower data rate and its own predefined maximum latency value. As the data is being compressed by various implementations of data compression systems, the system may be able to assess the ability of the lower data rate channel to be able to transfer the data currently being supplied to it at the current compression rate. If the data channel cannot handle the amount of data being supplied at a desired latency value, then implementations of data compression systems may utilize various compression and decompression algorithm implementations that decimate the data being sent until the channel can then transfer the data at a desired latency value. In some implementations, lossy compression algorithms may also be used to reduce the amount of data being sent. In particular implementations, the assessment may be performed as the data compression system is sending data. In other implementations, the assessment may be performed using any of a wide variety of forecasting methods that may utilize various characteristics of the data channel to predict the amount of data that can be transmitted.

Figure 1:
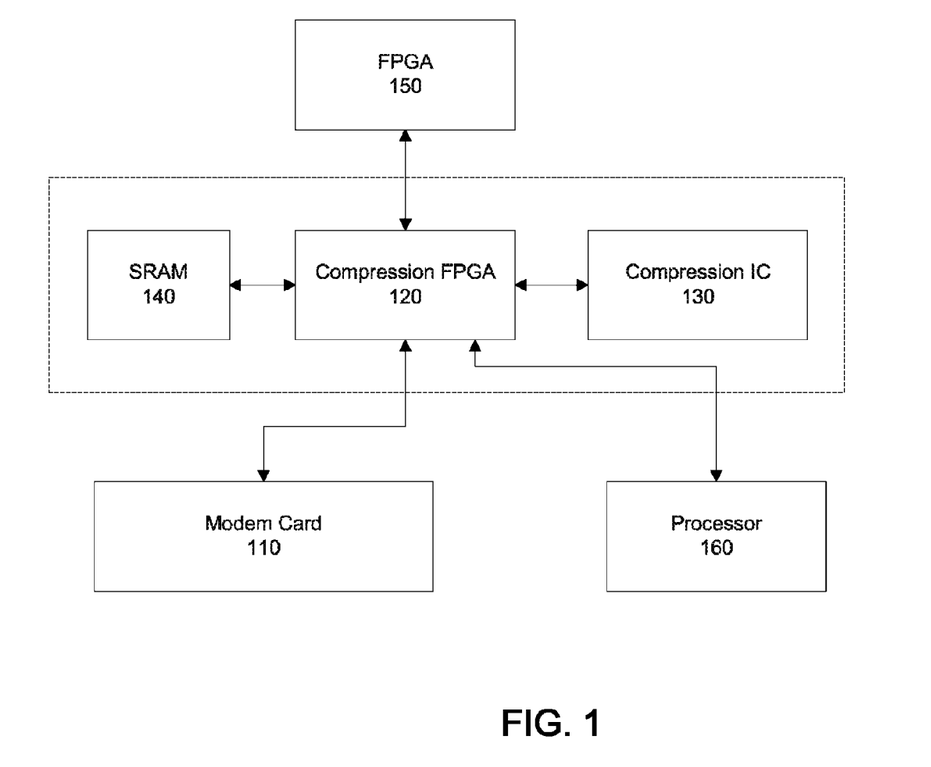
FIG. 1 is a block diagram of a particular implementation of a data compression system.

As illustrated by the example shown in FIG. 1, a data channel enters the data compression system from the modem card 110 and is compressed by the compression Field Programmable Gate Array (FPGA) 120 using a compression integrated circuit (IC) 130 and SRAM 140 storage. The compression FPGA 120 is controlled by a second FPGA 150 and/or a processor 160. The compressed data is then transmitted back to the modem card 110 where it may exit the data compression system.

Figure 2:
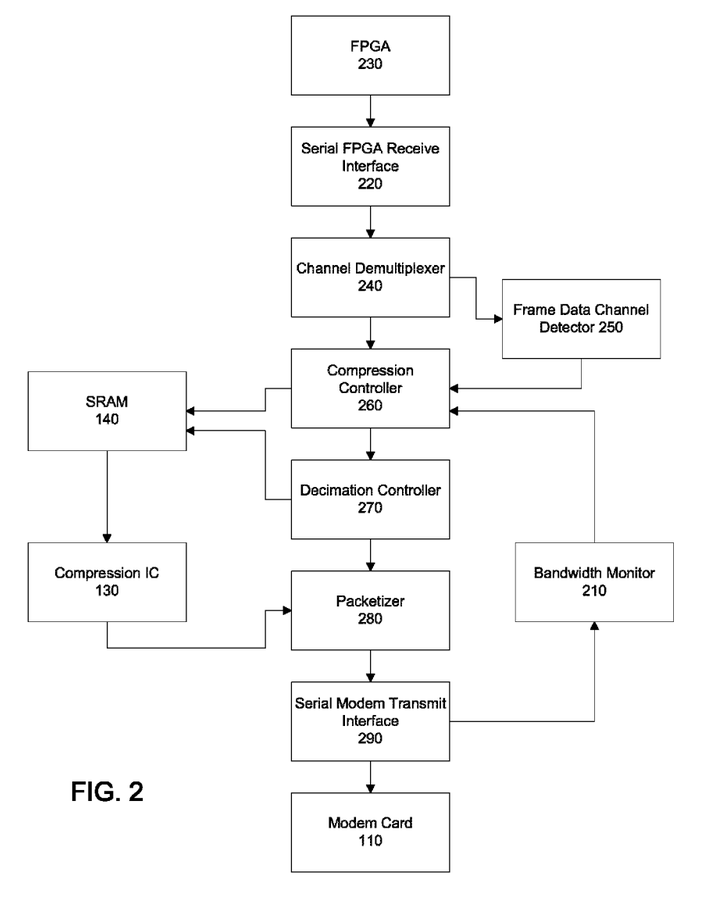
FIG. 2 is a block diagram of an implementation of a transmit side of a data compression system.

FIG. 2 depicts an implementation of a data compression system in which data is received into a serial FPGA receive interface 220 that is controlled by a processor or FPGA 230. While it may be advantageous for the serial FPGA receive interface 220 to receive up to 128 time slots (TS) for a maximum data rate of 8.192 Mbps, the serial FPGA receive interface 220 may be configured to have any other number of time slots. Communication is required from the receiver back to the transmitter and point to point non-symmetrical and symmetrical links may be supported. The serial FPGA receive interface 220 may comprise four inputs: data, a clock, a data validation signal, and a synchronization bit that are demultiplexed in the channel demultiplexer 240. When the TS are de-multiplexed, they are searched for HDLC (High-level Data Link Control) frames and any TS containing HDLC frames will be protected from decimation and the HDLC frames are added to a list of protected Traffic Channels (TCHs). When the data validation signal is inactive, the data bit will be discarded. The synchronization bit is active for the first bit of the first TS. If a TS0 (Time Slot 0) is included, it must be programmed into the control register and will be treated as a 16 k, 32 k, or 64 k TCH containing an HDLC frame is treated, meaning that the TS0 will be detected by the frame data channel detector 250 and will bypass the decimation controller 270 and will not be decimated. In a preferred embodiment, HDLC frames are de-multiplexed for compression into the 16 k, 32 k, or 64 k TCHs as they are detected, however, the FPGA may also be programmed to de-multiplex all other TCHs as 16 k TCHs.

The compression controller 260 receives de-multiplexed TCHs from the de-multiplexer 240. In an implementation, non-HDLC TCHs are de-multiplexed as 8 k or 16 k TCHs and HDLC TCHs are de-multiplexed according to what TCHs they are identified in. A compression session typically contains up to the eight de-multiplexed TS. One block, which is typically 5 ms but could be of any other length, is buffered and separated into sessions of up to 8 TS per session resulting in up to 16 sessions per block. To reduce latency, a set of sessions, typically 3 to 4 sessions, are compressed every 1 ms. Once the session data is buffered in the SRAM 140, the compression controller 260 sends commands to the decimation controller 270 to transfer context data and payload data from SRAM 140 to the compression engine. After compression, pointers are updated so that the payload data is included in the context data for the next block.

If the compression rate is insufficient to transmit the data with low enough latency, data is decimated by the decimation controller 270 until the desired data rate is met. The TCH may be decimated in a round-robin selection, however, the TS0's and HDLC TCH bypass decimation controller 270 and are therefore, not decimated. In some embodiments, adjacent 8 k TCH are decimated equivalently to one 16 k TCH to prevent decimating only half of a single 16 k TCH. The output data rate is then checked against the channel bandwidth. If the output data rate is too high for the channel rate, additional TCH are decimated and if the output data rate is too low for the channel rate, the decimation rate is then decreased. Some implementations use an output FIFO, a programmable FIFO level, and/or programmable filter values. The filters may be used to maintain the FIFO level within a window around the programmed FIFO level. Decimation may also be performed by discarding the data from the TCH to be decimated before the session containing these TCH is compressed. The information about the TCH decimated is sent to the receiver in the packet header. The receiver then replaces 40 ms of decimated data by replaying the previous 40 ms of data. The decimation rate may be monitored to determine whether adequate channel bandwidth is available for the transmit data, however, the receiver does not send an acknowledgment for decimation information.

Figure 3:
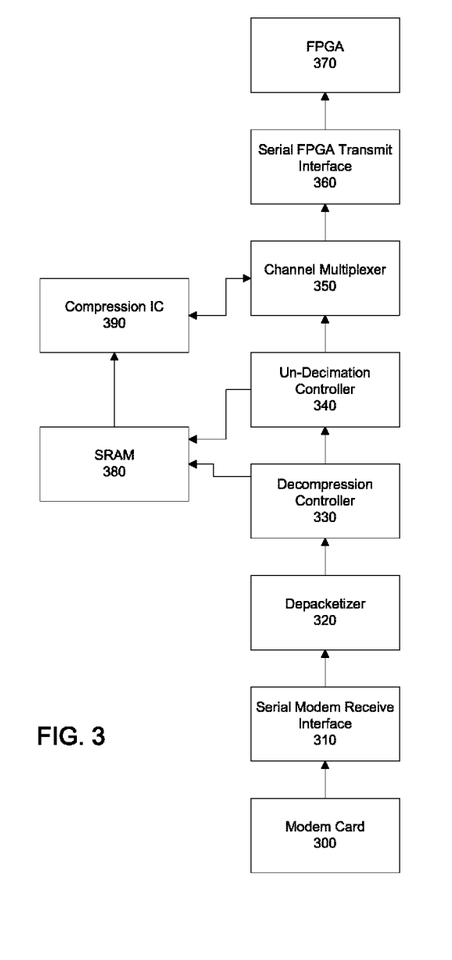
FIG. 3 is a block diagram of an implementation of a receive side of a data compression system.

The packetizer 280 places one compressed session into a packet for transmission at a time. When the status of the HDLC frames in a session changes, a description of the location of HDLC TCH in the session is added to the packet. This method may be used to notify the receiver if a TCH has been added or removed from the list of TCH that carry HDLC frames. When the data is transmitted through the serial modem transmit interface 290 through the modem card 300 and to the serial modem receive interface 310, the receiver may send acknowledgment packets to confirm that the HDLC TCH changes have been received. The serial modem transmit interface 290 may insert sync marks and offset to the next packet boundary or pad packets if the output FIFO goes empty.

If a link is too congested due to insufficient data compression, non-HDLC TCH may be decimated to reduce bandwidth required. Decimation of a TCH may be accomplished, for example, by dropping a portion of a TCH so that it is removed from the context data. The decimated data is then replaced on the receiver side with an equal portion of previous data. A decimation descriptor is sent to the receiver to identify the TCH to re-play in this manner.

The bandwidth monitor 210 compares the output data rate to the output channel bandwidth and provides instructions to the compression controller when the decimation rate needs to be increased or decreased. In a particular implementation, a filter mechanism may be used to keep the output FIFO fill level within a programmed window. Further, the bandwidth monitor may limit the amount of latency accumulated in the output FIFO and limit excessive decimation that results in not fully utilizing the available bandwidth of a channel. A sync mark pattern may be transmitted on a fixed interval to enable the serial modem receive interface 310 to synchronize to the input data and maintain synchronization. Packets may be of variable size so the sync marks are followed by an offset to the next packet header.

After the data compression system has decimated (or lossy compressed) the data to allow it to be transmitted across the lower data rate data channel, implementations of data compression systems disclosed in this document may be able to regenerate the decimated data using the compression algorithm itself. In particular implementations, the regeneration process may involve replacing the decimated data with data previously received and equal in quantity to the quantity of data decimated. Since the data channel may contain multiplexed data multiplexed in one of a variety of ways, implementations of the system may include the capability to demultiplex the data in the data channel using all of the possible ways and analyze the resulting data streams for framing information. When framing information is found in a particular stream, then the system has identified the demultiplexing scheme used to process that stream. In particular implementations of the system, the process of demultiplexing takes place prior to the decimation step, in order to ensure that all of the potential data channels available for decimating are properly identified and to ensure that particular information in the initially multiplexed data channel, such as framing information, is not removed during the decimation process. In addition, implementations of compression systems may reorganize data resulting from the demultiplexing process prior to the various compression steps to obtain better compression ratios.

In a particular implementation, the serial modem receive interface synchronizes to the sync mark. Data may be discarded until the synchronization is obtained. Data is then discarded until the next packet boundary is reached. Then packets are transferred to the depacketizer 320 which will discard packets until a particular packet, for example, a packet with Session ID=0, is found at which point the receiver begins processing packets on the first packet of a block. Once processing has begun, packets are accepted and a cyclic redundancy check (CRC) occurs. If the CRC fails, the packet is discarded. If the CRC passes, the packet information is transferred to the decompression controller 330.

The decompression controller 330 controls the decompression of packet payload and maintains context data. It may utilize a read command from context memory to load context data into the decompression engine for decompression. The decompression controller 330 may then issue a write command to the decompression engine to load the packet payload data into the decompression engine. Data is then transferred to the un-decimation controller 340 which rebuilds the session by interleaving writes of the decompressed data from the decompression controller 330 to SRAM 380 where the data may be transferred to decompression IC 390.

The channel multiplexer 350 then de-multiplexes the data set into TS and groups which are then transferred to the serial FPGA transmit interface 360. The serial FPGA transmit interface 360 accepts TS from the channel multiplexer 350 and converts them into a serial output stream which is transmitted to the FPGA 370. It also may output a sync bit on the first bit of a TS.

In particular implementations of data compression systems, decimation may take place over one or more data channels and the identity of the particular channel(s) being decimated may be tracked. Determining which channel(s) will be decimated may be controlled using a predefined selection scheme which may ensure that, when multiple channels are involved, the decimation takes place evenly or is spread evenly across all of the data channels. In addition, the data compression system may analyze the data in the data channel(s) and determine whether the data is of a particular kind that should not be decimated. For example, if the system determines that the data is framing information, then particular implementations of the system would not decimate that data and would remove the channel containing the data from a list of data channels that could potentially be decimated. To achieve the proper rate, the system may then decimate data in another channel.

Particular implementations of data compression systems may process the data being received in one or more data channels using short blocks to ensure that the resulting latency of the data remains low. The actual size of the block may be programmable, thereby allowing programmable control of the latency of the resulting compressed data stream. In particular implementations, the data being compressed in small blocks may be reorganized prior to compression to enable the achievement of better compression ratios.

Figure 4:
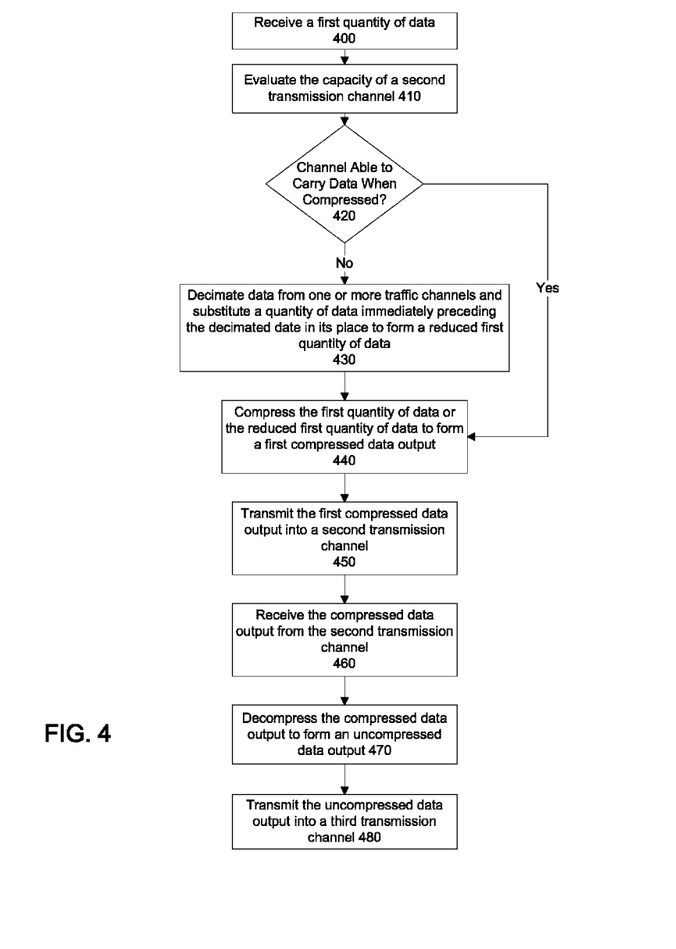
FIGS. 4-5 depict two methods of data compression.

FIG. 4 illustrates a method of data compression that is accomplished by the data compression systems such as those described above. A first quantity of data is received 400 from a telecommunication channel that has a known bandwidth and the capacity of a second transmission channel is then evaluated 410. A determination is then made as to whether the channel is able to carry the data if it is compressed 420. If so, the data is compressed, either lossy or losslessly, to form a first compressed data output 440. If not, the data is decimated from one of more traffic channels and a quantity of data immediately preceding the decimated data is substituted in its place to form a reduced first quantity of data 430. The reduced first quantity of data is then compressed to form a first compressed data output 440. This first compressed data output is then transmitted into a second transmission channel 450 and is then received 360 and decompressed to form an uncompressed data output 470. The uncompressed data output may then be transmitted into a third transmission channel 480.

Figure 5:
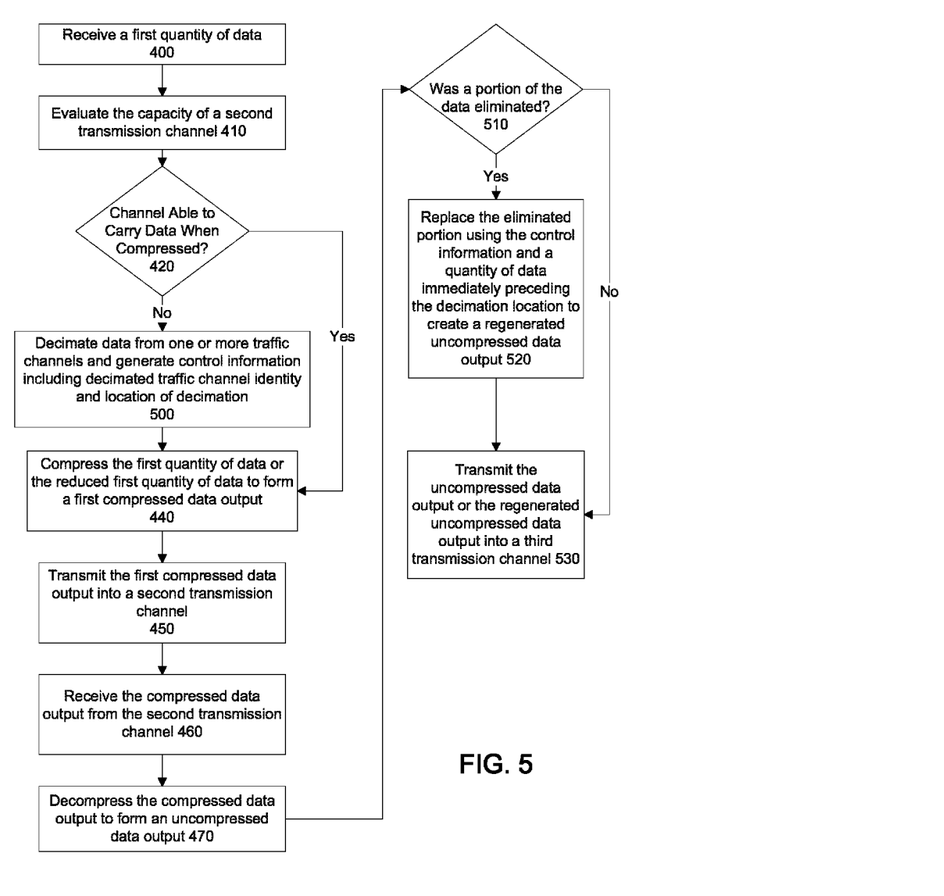

In the particular implementation depicted in FIG. 5, if it is determined that the data channel is unable to carry the compressed data 420, the data from one or more traffic channels is then decimated and control information including decimated traffic channel identity and location of the decimation is generated 500. If it is later determined that a portion of the data was eliminated 510, the eliminated portion of the data is replaced using the control information and a quantity of data that immediately precedes the decimation location thereby creating a regenerated uncompressed data output 520. If this is not the case, the uncompressed data output is then transmitted into a third transmission channel 530.

The various methods and algorithms disclosed in this document may be implemented using a wide variety of hardware and hardware configurations. For example, the data compression system may be constructed in the form of a card containing a compression processor coupled to a computer system containing a field programmable gate array (FPGA). In other implementations, the data compression system may be implemented as part of a computer, a server, or one more computers or servers. The data compression system and related methods may also be included as a component of a modem, such as a satellite modem.

The materials used for implementations of data compression systems may be made of conventional materials used to make goods similar to these in the art, such as, by non-limiting example, semiconductor materials, plastics, metals, composites, and the like. Those of ordinary skill in the art will readily be able to select appropriate materials and manufacture these products from the disclosures provided herein.

In places where the description above refers to particular implementations of data compression systems or methods, it should be readily apparent that a number of modifications may be made without departing from the spirit thereof and that these implementations may be applied to other data compression systems and methods.

The invention claimed is:

1. A method of compressing data comprising:
   receiving, at an input of a first processor included in a transmit side of a data compression system, a first quantity of data from a first telecommunication channel having a known bandwidth;
   losslessly compressing the first quantity of data using a lossless compression algorithm and the first processor to form losslessly compressed data;
   evaluating, using the first processor, whether a bandwidth of a second telecommunication channel is sufficient to carry the losslessly compressed data;
   receiving at the input a second quantity of data following the first quantity of data in a time order of the data in the first telecommunication channel;
   if the bandwidth of the second telecommunication channel is evaluated to be insufficient, then lossy compressing the second quantity of data using a lossy compression algorithm and the first processor, to form first reduced data, and then losslessly compressing the first reduced data using the lossless compression algorithm and the first processor to form first compressed data; and
   if the bandwidth of the second telecommunication channel is evaluated to be sufficient, then losslessly compressing the second quantity of data using the lossless compression algorithm and the first microprocessor to form second compressed data; and
   transmitting the first compressed data and the second compressed data into the second telecommunication channel using a transmission module.

2. The method of claim 1, further comprising:
   receiving the first compressed data and the second compressed data at an input of a second processor included in a receive side of the data compression system;
   decompressing the first compressed data and the second compressed data using a decompression algorithm and the second processor to form an uncompressed data output; and
   transmitting the uncompressed data output into a third telecommunication channel.

3. The method of claim 2, further comprising depacketizing a plurality of packets including the first compressed data and the second compressed data using the second processor prior to decompressing the first compressed data and the second compressed data and packetizing the first compressed data output to form a plurality of packets using the first processor.

4. The method of claim 1, wherein lossy compressing the second quantity of data further comprises:
   eliminating a portion of the second quantity of data using the first processor to form the first reduced data by decimating data for a predetermined decimation time period from one or more traffic channels included in the second quantity of data; and
   including in a time sequence of each of the one or more traffic channels a third quantity of data, the third quantity of data included in a time period of each of the one or more traffic channels that is equal to the predetermined decimation time period where the third quantity of data is taken from the time sequence of each of the one or more traffic channels immediately preceding a location in the time sequence of the predetermined decimation time period.

5. The method of claim 4, wherein decimating data for the predetermined decimation time period from one or more traffic channels further comprises decimating using a predefined traffic channel decimation scheme that ensures that any of the one or more traffic channels including framing information are not decimated.

6. The method of claim 5, wherein decimating data for the predetermined decimation time period further comprises ensuring that each of the one or more traffic channels is decimated substantially equally.

7. The method of claim 4, further comprising:
demultiplexing at least two of the one or more traffic channels included in the second quantity of data prior to decimating data from one of the one or more traffic channels; and
multiplexing at least two of the one or more traffic channels included in the uncompressed data output to form a multiplexed uncompressed data output;
wherein transmitting the uncompressed data output further comprises transmitting the multiplexed uncompressed data output into the third telecommunication channel.

8. The method of claim 4, further comprising controlling a latency of the first compressed data and of the second compressed data transmitted into the second telecommunication channel by organizing and processing the first compressed data and the second compressed data in short blocks.

9. The method of claim 2, wherein lossy compressing the second quantity of data further comprises:
eliminating a portion of the second quantity of data using the first processor to form the first reduced data by:
decimating data from each of one or more traffic channels included in the second quantity of data for a predetermined decimation time period using the first processor;
generating control information including the identity of each of the one or more traffic channels decimated and the location of decimation in a time sequence of each of the one or more traffic channels; and
transmitting the control information to an un-decimation module associated with the second processor included in the receive side; and
wherein decompressing the first compressed data and the second compressed data with the second processor further comprises:
determining whether the portion of the second quantity of data was eliminated using the control information and:
if so, decompressing the first reduced data using the decompression algorithm and the second processor forming first uncompressed reduced data and replacing the data decimated from each of the one or more traffic channels to form a regenerated uncompressed data output using the second processor by including, at the location of decimation in the time sequence of each of the one or more traffic channels of the first uncompressed reduced data identified as decimated, a quantity of data from each traffic channel for a time period equal to the predetermined decimation time period taken from the time sequence of each traffic channel identified as decimated immediately prior to the location of the decimation; and if not, decompressing the second compressed data using the decompression algorithm and the second processor to form the uncompressed data output; and
wherein transmitting the uncompressed data output into the third telecommunication channel further comprises transmitting the uncompressed data output or the regenerated uncompressed data output into the third telecommunication channel.

10. The method of claim 9, wherein decimating data from each of one or more traffic channels further comprises decimating using a predefined traffic channel decimation scheme that ensures that any of the one or more traffic channels including framing information are not decimated.

11. The method of claim 10, wherein decimating data from each of one or more traffic channels further comprises ensuring that each of the one or more traffic channels is decimated substantially equally.

12. The method of claim 9, further comprising:
demultiplexing at least two of the one or more traffic channels included in the second quantity of data prior to decimating data from one of the one or more traffic channels; and
multiplexing at least two of the one or more traffic channels included in the uncompressed data output or the regenerated uncompressed data output to form a multiplexed uncompressed data output; and
wherein transmitting the uncompressed data output or the regenerated uncompressed data output further comprises transmitting the multiplexed uncompressed data output into the third telecommunication channel.

13. The method of claim 9, further comprising controlling a latency of the first compressed data and the second compressed data transmitted into the second telecommunication channel by organizing and processing the first compressed data and the second compressed data in short blocks.

14. A data compression system configured to transmit and receive compressed data, the system comprising:
a transmit side comprising:
a first receive interface adapted to receive a first quantity of data from a first telecommunication channel; and
a compression controller coupled to the first receive interface, to a lossless compression controller, and to a bandwidth monitor, the lossy compression controller and the bandwidth monitor coupled to a first transmit interface adapted to transmit a compressed first quantity of data into a second telecommunication channel;
wherein the bandwidth monitor evaluates the bandwidth of the second telecommunication channel and communicates bandwidth information to the compression controller;
wherein a decimation controller is adapted to lossy compress a portion of a second quantity of data in a time sequence of data in the first telecommunication channel in response to a lossy compression control signal communicated by the compression controller to form a reduced second quantity of data if the compression controller determines, using the bandwidth information, that the bandwidth second transmission channel is insufficient to carry the first quantity of data when compressed; and
wherein the compression controller is adapted to send the second quantity of data or the reduced second quantity of data to a compression processor coupled with the data compression system, to receive the compressed first quantity of data after compression, and to transmit the compressed first quantity of data into the second telecommunication channel using a first transmit interface.

15. The system of claim 14, further comprising:
a receive side integral with the transmit side, the receive side comprising:
- a second receive interface adapted to receive a third quantity of data from a third telecommunication channel; and
- a decompression controller coupled to the second receive interface, a decompression controller, and an lossy decompression controller;
- wherein the decompression controller is adapted to send the third quantity of data to the compression processor and to receive a decompressed second quantity of data from the compression processor after decompression;
- wherein the decompression controller is adapted to determine whether a portion of the decompressed second quantity of data was decimated and to transmit a lossy decompression control signal to the lossy decompression controller, and if so, the lossy decompression controller is further adapted to replace the portion of the decompressed second quantity of data in response to the lossy decompression control signal to form a regenerated decompressed third quantity of data; and
- wherein the decompression controller is adapted to transmit the decompressed third quantity of data or the regenerated decompressed third quantity of data into the first telecommunication channel.

16. The system of claim 15, further comprising:
- a packetizer coupled to the compression controller and to the first transmit interface, the packetizer adapted to receive the compressed first quantity of data and packetize the compressed first quantity of data to form a plurality of packets; and
- a depacketizer coupled to the decompression controller and to the second receive interface, the depacketizer adapted to depacketize a plurality of packets that include the third quantity of data.

17. The system of claim 14, further comprising a channel demultiplexer coupled to the first receive interface and the compression controller, the channel demultiplexer adapted to demultiplex one or more traffic channels included in the first quantity of data.

18. The system of claim 17, further comprising a framing data detector coupled to the channel demultiplexer and the compression controller, the framing data detector adapted to evaluate the data included in each of the one or more traffic channels to determine which of the one or more traffic channels includes frame information and to transmit a frame channel control signal to the compression controller wherein the compression controller is further adapted to use the frame channel control signal to ensure that the one or more traffic channels including frame information are not lossy compressed by the lossy compression controller.

* * * * *